United States Patent
Van Empel

(10) Patent No.: US 9,455,172 B2
(45) Date of Patent: Sep. 27, 2016

(54) ELECTROSTATIC CLAMP

(71) Applicant: ASML Netherlands B.V., Veldhoven (NL)

(72) Inventor: Tjarko Adriaan Rudolf Van Empel, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 103 days.

(21) Appl. No.: 14/380,622

(22) PCT Filed: Jan. 29, 2013

(86) PCT No.: PCT/EP2013/051679
§ 371 (c)(1),
(2) Date: Aug. 22, 2014

(87) PCT Pub. No.: WO2013/127589
PCT Pub. Date: Sep. 6, 2013

(65) Prior Publication Data
US 2015/0036258 A1 Feb. 5, 2015

Related U.S. Application Data

(60) Provisional application No. 61/604,945, filed on Feb. 29, 2012.

(51) Int. Cl.
*H01L 21/683* (2006.01)
*G03F 7/20* (2006.01)

(52) U.S. Cl.
CPC ....... *H01L 21/6833* (2013.01); *G03F 7/70708* (2013.01)

(58) Field of Classification Search
CPC .................................................. H01L 21/6833
USPC ........................................................ 361/234
See application file for complete search history.

(56) References Cited

U.S. PATENT DOCUMENTS 3,980,929 A 9/1976 Bresnick
4,692,836 A * 9/1987 Suzuki ................ H01L 21/6831
  279/128

(Continued)

FOREIGN PATENT DOCUMENTS

JP 2000-277595 10/2000
JP 2003-243493 8/2003

OTHER PUBLICATIONS

International Search Report mailed Apr. 3, 2013 for corresponding International Patent Application No. PCT/EP2013/051679 (3 pages).

*Primary Examiner* — Scott Bauer
(74) *Attorney, Agent, or Firm* — Pillsbury Winthrop Shaw Pittman LLP

(57) ABSTRACT

An electrostatic clamp configured to, in use, hold an article, such as a reticle or a wafer in a lithographic apparatus. The clamp includes a lower portion; an upper portion formed of a dielectric material, and a plurality of electrodes disposed between the lower portion and the upper portion. The electrodes include a first electrode configured in use to be held at a first voltage, at least one intermediate electrode configured in use to be held at a second voltage, and a ground electrode. The at least one intermediate electrode is located between the first electrode and the ground electrode and the second voltage is between the first voltage and ground to reduce the voltage across a barrier between the electrodes and so reduce the risk of high-voltage breakdown.

12 Claims, 5 Drawing Sheets

(56) References Cited

U.S. PATENT DOCUMENTS

| | | | | |
|---|---|---|---|---|
| 5,880,923 | A * | 3/1999 | Hausmann | H01L 21/6833 279/128 |
| 6,538,873 | B1 * | 3/2003 | Larsen | F04B 43/043 361/233 |
| 7,199,994 | B1 * | 4/2007 | Levinson | G03F 7/70708 361/233 |
| 7,245,357 | B2 | 7/2007 | Van Zwet et al. | |
| 2005/0213279 | A1 * | 9/2005 | Hayakawa | H01L 21/6833 361/234 |
| 2006/0102277 | A1 | 5/2006 | Maria Zaal et al. | |
| 2007/0223173 | A1 | 9/2007 | Fujisawa et al. | |
| 2008/0151466 | A1 | 6/2008 | Simpson | |
| 2010/0277850 | A1 * | 11/2010 | Chang | H01L 21/6831 361/234 |
| 2011/0126406 | A1 | 6/2011 | Van Mierlo et al. | |
| 2011/0170085 | A1 | 7/2011 | Sijben | |

* cited by examiner

ELECTROSTATIC CLAMP

CROSS-REFERENCE TO RELATED APPLICATIONS

This application is the U.S. national phase entry of International Patent Application No. PCT/EP2013/051679, filed Jan. 29, 2013, which claims the benefit of U.S. provisional application 61/604,945, which was filed on 29 Feb. 2012, and which is incorporated herein in its entirety by reference.

FIELD

The present invention relates to an electrostatic clamp for holding an object, and semiconductor manufacturing apparatus that includes the electrostatic clamp.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Electrostatic clamps may be used in lithographic apparatuses operating at certain wavelengths, e.g. EUV, since at these wavelengths, certain regions of the lithographic apparatus operates under vacuum conditions. An electrostatic clamp may be provided to electrostatically clamp an object, such as a mask or a substrate (wafer) to an object support, such as a mask table or a wafer table, respectively. An electrostatic clamping force may also be used to clamp an electrostatic clamp to a wafer table or other piece of lithographic apparatus, operating in a double-sided mode.

Conventional electrostatic clamps comprise a stack in which an electrode or plurality of electrodes are disposed between an upper (first) and a lower (second) dielectric or isolating layer. For example, if the lower layer is polished, then the electrodes are deposited on the upper polished surface. Then the upper layer is placed on top of the electrodes. The upper and lower layers are bonded. Each electrode may comprise a plurality of portions. The electrodes or electrode portions do not necessarily cover the entire surface of the lower layer. At some places no electrode may be present. The region between electrodes or electrode portions may be filled with a barrier (dielectric or insulator) layer or left empty.

The electrodes may be driven at different voltages, such as +3 kV and 0 V, or +3 kV and −3 kV, resulting in an electric field being created between different electrodes. The barriers between electrodes may be subject voltages of 3 kV or more. For example, if adjacent electrodes were driven at +3 kV and −3 kV, the barrier between the electrodes would be subject to a 6 kV potential difference.

The voltage level a barrier can withstand is a factor in its clamping performance. A failure mechanism exists whereby the barrier between electrodes fails, resulting in a discharge between electrodes, and a reduction in clamping force. Any reduction in clamping force may significantly impact the performance of the electrostatic clamp, which may result in reduced throughput of a lithography system, and reduced output of integrated circuits.

SUMMARY

It is desirable, for example, to provide an improved electrostatic clamp that gives a high clamping force without being subject to significant breakdown failure rates.

According to an aspect of the invention, there is provided an electrostatic clamp configured to, in use, hold an article in a lithographic apparatus. The clamp includes a lower portion; an upper portion formed of a dielectric material; and a plurality of electrodes disposed between the lower portion and the upper portion. The electrodes include a first electrode configured in use to be held at a first voltage, at least one intermediate electrode configured in use to be held at a second voltage, and a ground electrode. The at least one intermediate electrode is located between the first electrode and the ground electrode and the second voltage is between the first voltage and ground.

Desirably, the at least one intermediate electrode is in use held at a voltage halfway between the first voltage and ground.

In some embodiments, a plurality of intermediate electrodes may be provided between the first electrode and the ground electrode and, in use, the voltage applied to each of the plurality of intermediate electrodes reduces from the first electrode to the ground electrode. Desirably, the voltage drop between the first electrode and a first intermediate electrode and between adjacent intermediate electrodes is the same.

Desirably, the first electrode and the at least one intermediate electrode share a common power supply and a resistive network is provided to divide the applied voltage between the first electrode and the at least one intermediate electrode. At least one resistor in the network may be a variable resistor.

In an embodiment of the invention, the clamp is a bipolar clamp that further includes a second first electrode and at least one second intermediate electrode located between the second first electrode and the ground electrode, wherein, in use, the second first electrode and the at least one second intermediate electrode are held, respectively, at a first voltage and a second voltage that are of opposite sign to the voltages applied to the first electrode and the first intermediate electrode, and wherein the second voltage applied to the second intermediate electrode is between the first voltage applied to the second first electrode and ground.

In an embodiment of the invention, the first electrode is generally rectangular and the clamp is configured for use as a reticle clamp. In an embodiment, the first electrode is generally in the shape of a segment of a circle and the clamp is configured for use as a wafer clamp.

According to another aspect of the invention there is provided a semiconductor manufacturing apparatus comprising an electrostatic clamp as described here above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
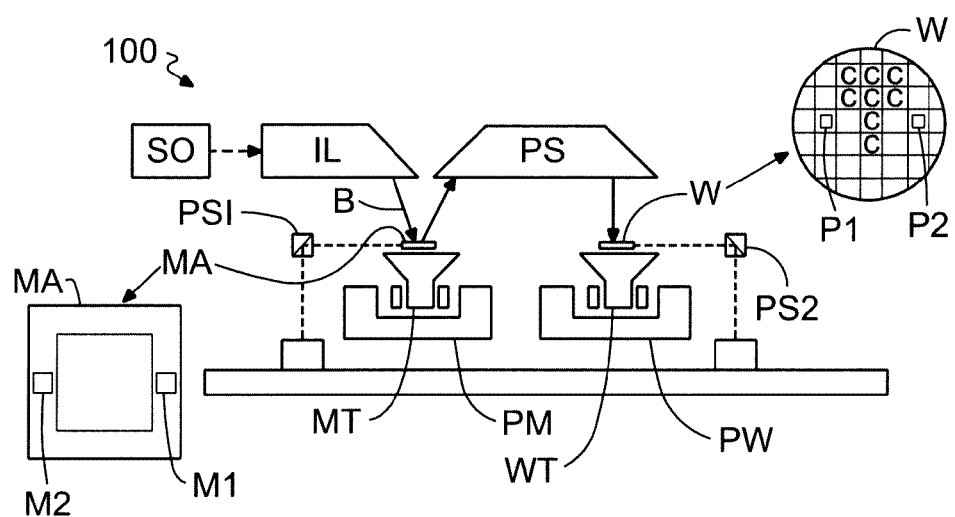
FIG. 1 depicts a lithographic apparatus in accordance with an embodiment of the invention.

FIG. 1 schematically depicts a lithographic apparatus 100 according to an embodiment of the invention. The apparatus includes an illumination system (illuminator) IL configured to condition a radiation beam B (e.g. UV radiation or EUV radiation); a support structure or support or pattern support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device and as will be discussed in more detail below the present invention relates to an electrostatic clamp. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The support structure and the substrate table may also be hereinafter referred to as an article support. An article includes but is not limited to a patterning device, such as a reticle, and a substrate, such as a wafer.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e. g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected by the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to mask-less lithography that utilizes programmable patterning device, such as a programmable mirror array of a type as referred to above.

Combinations and/or variations on the above described modes of use or entirely different modes of use may also be employed.

Figure 2:
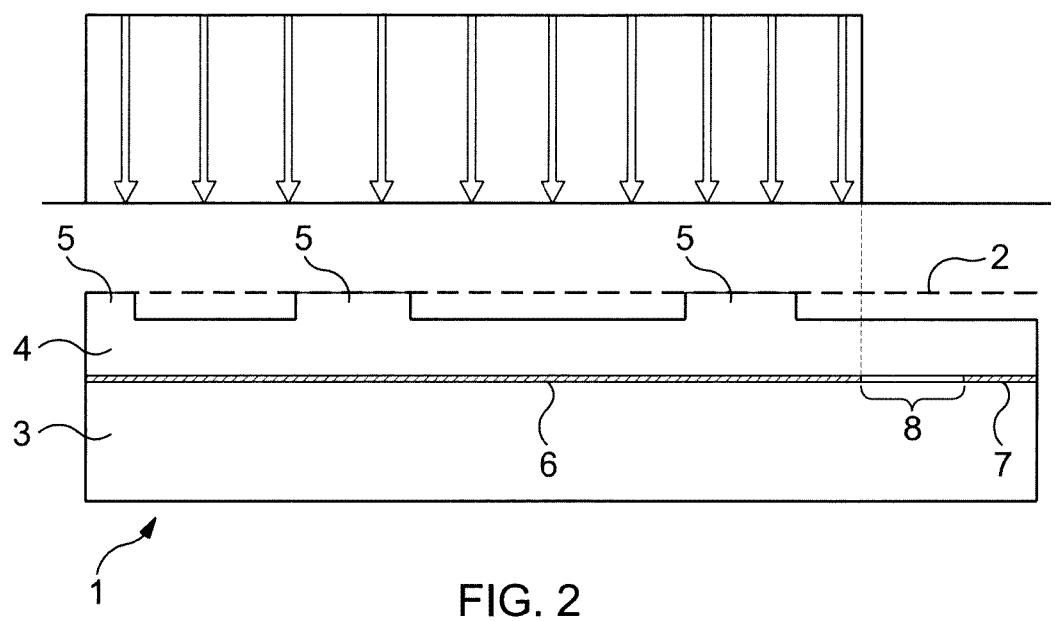
FIG. 2 depicts a partial cross-section of a conventional edge clamp and schematically illustrates the clamp pressure.

FIG. 2 depicts a partial cross-section of an electrostatic clamp 1 according to the prior art as may be applied to the edge of an article such as a reticle or wafer. FIG. 2 also schematically illustrates by way of the arrows in the Figure the clamp pressure that may be generated by the clamp. The clamp 1 comprises a lower portion 3 formed of an insulating material, and an upper portion 4 formed of a dielectric material. The upper portion 4 is formed with a plurality of burls 5 whereby the top of the burls determine a plane 2 in which the article (not shown) is to be held. A first electrode 6 is provided between the lower portion 3 and the upper portion 4 and the first electrode 6 is adapted to be held at a voltage (typically 3 kV) to generate an electrostatic clamping force. A ground electrode 7 is held at ground and is spaced from the first electrode 6 by a void 8 which acts as a barrier between the first and ground electrodes. The void 8 may be filled with an insulating material, a dielectric material, or may be left empty.

The downwardly pointing arrows in FIG. 2 schematically illustrate the clamping pressure that the conventional clamp of FIG. 2 may generate. The length of the arrows is indicative of the clamping force and it will be seen that a uniform clamping pressure may be generated across with width of the first electrode the magnitude of which will depend on a number of parameters including the applied voltage, the dielectric constant of the upper portion 4, and the dimensions of the various parts of the clamp 1 as will be explained in the following.

An article may be held in plane 2 by an electrostatic clamping force when a voltage is applied to the electrode 6. The electrostatic or capacitive clamping force can be related to the applied voltage according to the formula:

$$P_{clamp} = \frac{\varepsilon_0}{2}\left[\frac{\varepsilon_R V}{d + g\varepsilon_R}\right]^2 \tag{1}$$

where:

$P_{clamp}$ is the clamping pressure exerted on the object to be clamped;

$\epsilon_0$ is the vacuum dielectric constant ($8.854 \times 10^{-12}$);

$\epsilon_R$ is the relative dielectric constant of the dielectric of the upper portion 4 of the clamp 1;

V is the voltage applied to the electrode 6;

d is the thickness of the upper portion 4 of the clamp 1; and g is the gap between the upper surface of the upper portion 4 of the clamp 1 and the plane 2 in which the object is to be clamps (the height of the burls 5).

It will be appreciated that the clamping pressure may be increased in the region of the burls due to the increased dielectric constant of the burls with respect to vacuum, and associated increase in capacitance in that region. In the region of a burl, equation (1) is still true, however the thickness d will be increased by the height of the burl, and the gap g will be reduced by the same amount, to zero.

A potential problem with such a prior art clamp is that a high voltage (e.g. 3 kV) will exist across the barrier 8 which may cause the barrier to suffer breakdown, which may cause a short-circuit between the first and ground electrodes.

Figure 3:
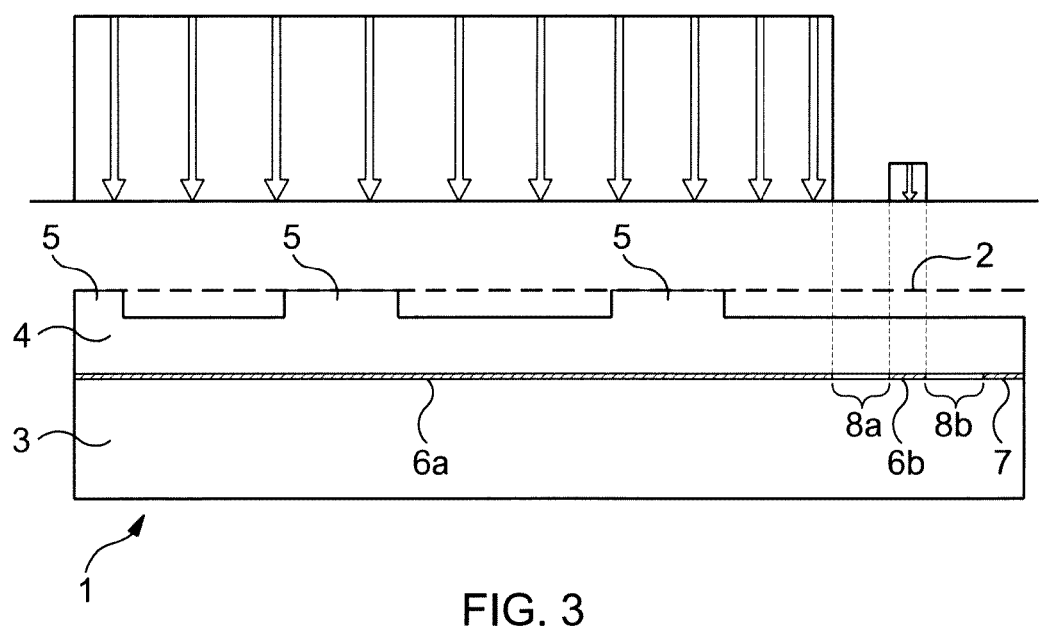
FIG. 3 depicts a partial cross-section of an edge clamp according to an embodiment of the invention and schematically illustrates the clamp pressure.

FIG. 3 is a view similar to FIG. 2 but of a clamp 1' according to an embodiment of the invention and like components will not be described again. In the embodiment of FIG. 3, a second electrode 6b is provided located intermediate between the first electrode 6a and the ground electrode 7. The second electrode 6b, which may be termed an intermediate electrode, is held at a voltage between the voltage applied to the first electrode 6a and ground and in particular may desirably be held at approximately half the voltage of the first electrode 6a. With the structure of FIG. 3, there are two barriers 8a, 8b—a first barrier 8a located between the first and second electrodes 6a, 6b, and a second barrier 8b located between the second electrode 6b and the ground electrode 7. As in FIG. 2, the downward arrows illustrate the strength of the clamping pressure, and as in FIG. 2, there is a uniform clamping pressure exerted by the first electrode 6a, but in addition there is a smaller clamping pressure exerted by the second electrode 6b. If the second electrode 6b is held at a voltage that is half that of the first electrode 6a the clamping pressure due to the second electrode 6b will be one quarter of the clamping pressure due to the first electrode, as the clamping pressure is dependent on the square of the voltage.

An potential advantage of the embodiment of FIG. 3 compared with the conventional structure of FIG. 2 is that because the second electrode 6b is held at a voltage between that of the first electrode and ground, the voltage across each barrier 8a,8b is reduced. In particular, if for example the second electrode is held at a voltage that is halfway between the voltage of the first electrode and ground, then the voltage across each barrier is halved compared with FIG. 2.

Figure 4:
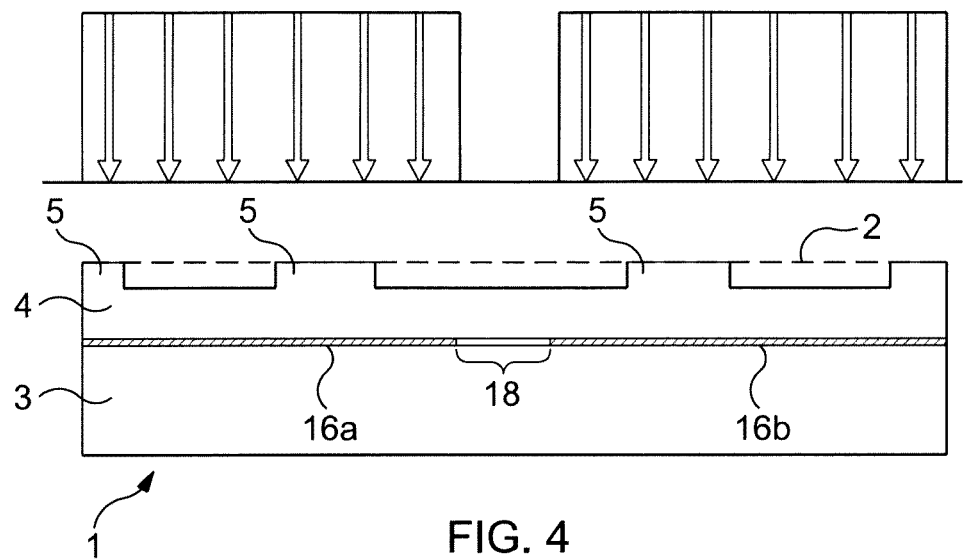
FIG. 4 depicts a cross-section of a conventional clamp and schematically illustrates the clamp pressure.

FIG. 4 shows another form of clamp known in the prior art. The clamp of FIG. 4 is known as a bipolar clamp and comprises two first electrodes 16a, 16b that are held at equal voltages but of opposite signs (e.g. electrode 16a may be held at +3 kV while electrode 16b is held at −3 kV). In all other regards, the two first electrodes 16a, 16b are identical and as with the prior art clamp of FIG. 2 and the electrodes will generate a uniform clamping pressure across their width. However, in the clamp of FIG. 4, the potential problem of possible barrier breakdown may be even more severe. In the clamp of FIG. 4, the two first electrodes 16a, 16b are separated by a single barrier 18 and because the two first electrodes are held at equal and opposite voltages the potential across the barrier is twice the voltage applied to each electrode individually (e.g. 6 kV if each electrode is held at +3 kV and −3 kV).

Figure 5:
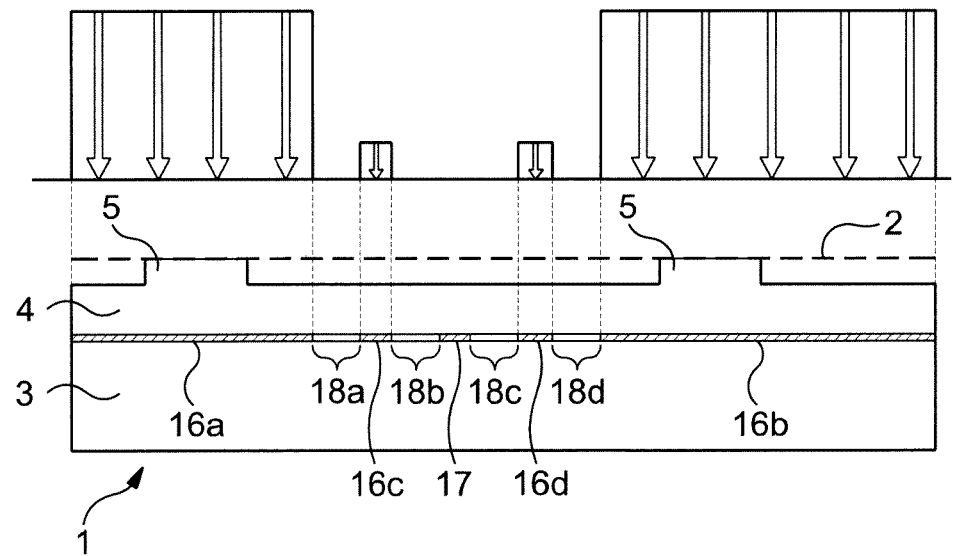
FIG. 5 depicts a cross-section of a clamp according to an embodiment of the invention and schematically illustrates the clamp pressure.

FIG. 5 shows an embodiment of a bipolar clamp 1" according to the present invention. In this embodiment, in addition to the two first electrodes 16a, 16b there is also provided a ground electrode 17 located equidistantly from each of the two first electrodes 16a,16b, and two second electrodes or intermediate electrodes 16c, 16d disposed respectively between the first electrode 16a and ground 17 and between the second first electrode 16b and ground 17b. This structure defines four barriers 18a, 18b, 18c, 18d; barrier 18a is located between electrodes 16a and 16c, barrier 18b is located between electrode 16b and ground electrode 17, barrier 18c is located between ground electrode 17 and electrode 16d, and finally barrier 18d is located between electrode 16d and electrode 16b.

It will be understood that electrodes 16c and 16d are held respectively at voltages that are the same sign as the voltages of electrodes 16a and 16b but at magnitudes between those voltages and ground. For example, if electrode 16a is held at +3 kV electrode 16c may be held at +1.5 kV, while if electrode 16b is held at −3 kV electrode 16d may be held at −1.5 kV. It will thus be seen that across each of the four barriers 18a, 18b, 18c, 18d there is a potential of only 1.5 kV compared with the 6 kV across the barrier 18 in the conventional structure of FIG. 4.

It will also be noted that in the embodiment of FIG. 5, the second electrodes 16c, 16d contribute a small clamping pressure as shown by the smaller arrows in the Figure.

Figure 6:
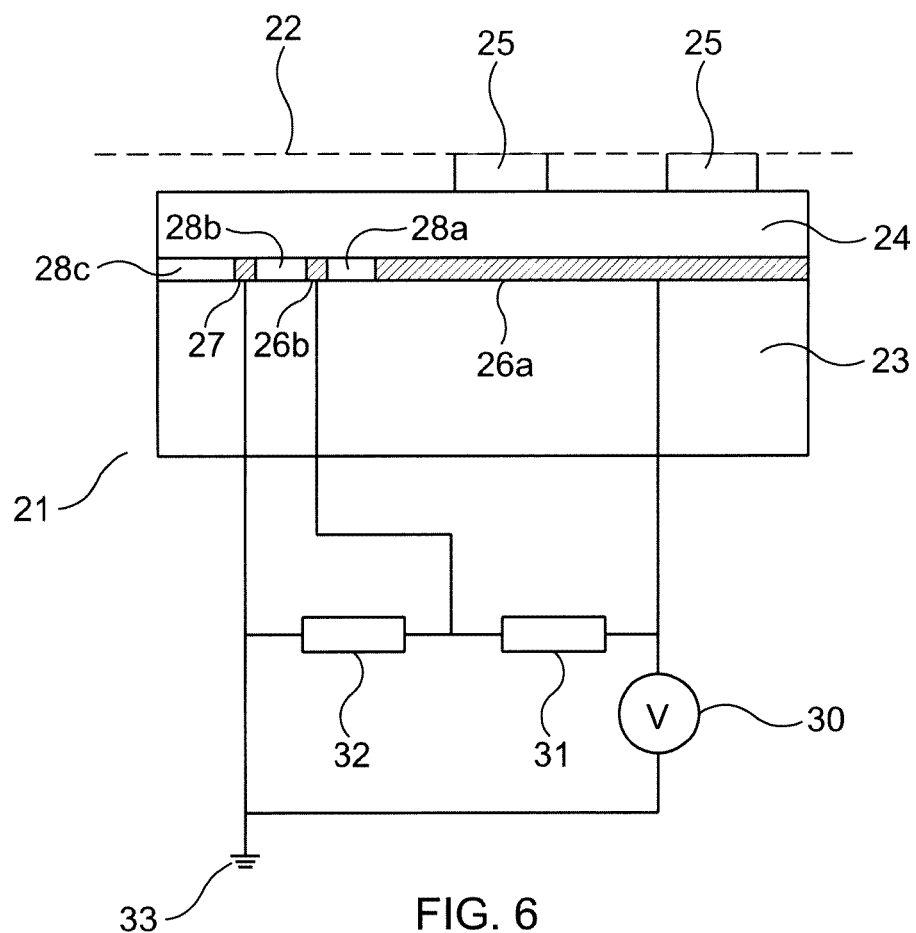
FIG. 6 depicts a partial cross-section of an electrostatic clamp according to an embodiment of the invention, taken along line X-X' in FIG. 7.

FIG. 6 depicts a partial cross-section (taken along X-X' of FIG. 7) of an electrostatic clamp according to an embodiment of the invention. In the embodiment shown in FIG. 6, the electrostatic clamp 21 is configured to, in use, hold an article in a substantially fixed plane 22 and includes a lower portion 23 and an upper portion 24 provided with burls 25 whereby the top of the burls determine the plane 22 in which the article is held. A first electrode 26a is disposed between the lower portion 23 and the upper portion 24 of the clamp. A second electrode 26b and ground electrode 27 are disposed between the lower portion 23 and upper portion 24 of the clamp 21, but displaced along the interface between the lower portion 23 and the upper portion 24, such that they do not contact one another or the first electrode 26a. Voids 28a, 28b, 28c defining barriers between the first and second electrodes 26a, 26b and second electrode 26b and the ground electrode 27 may be filled with an insulating or dielectric material, or left empty.

A voltage supply 30 may be provided which is configured to supply a voltage to at least the first electrode 26a. A resistor 31 may be configured to couple the first and the second electrodes 26a, 26b to each other. A further resistor 32 may be configured to couple the second electrode 26b to the ground electrode 27. The ground electrode 27 may be grounded by the provision of an earth connection 33.

It will be appreciated that the voltage at the first electrode 26a will be substantially similar to that supplied by the voltage supply 30. The voltage at the second electrode 26b will be defined by the ratio of the resistances of the first resistor 31 and the second resistor 32 as described in the equation:

$$V_2 = \frac{R_2}{R_1 + R_2} \times V_S \qquad (2)$$

where:
 $V_2$ is the voltage at the second electrode 26b;
 $R_2$ is the resistance of the second resistor 32;
 $R_1$ is the resistance of the first resistor 31; and
 $V_s$ is the voltage supplied by the voltage supply 30.

In an embodiment of the invention, the resistances of the first resistor 31 and the second resistor 32 are substantially the same. For similar resistances $R_1$ and $R_2$ the voltage $V_2$ will be approximately half of the supply voltage $V_s$. With these resistor values, the voltage between the first electrode 26a and the second electrode 26b ($V_s-V_2$) will be approximately half of the voltage supplied by the voltage supply 30. The voltage between the second electrode 26b and the third electrode 27 will also be approximately half of the voltage supplied by the voltage supply 30.

It will be appreciated that with the introduction of an intermediate electrode (here the second electrode 26b), the barriers 28 between any two electrodes are subjected to a voltage that is half of the voltage that is applied to the first electrode 26a. By reducing the maximum voltage which any barrier must withstand by a factor of two, the risk of breakdown failure of the barrier, and thus the clamp, is significantly reduced.

Figure 7:
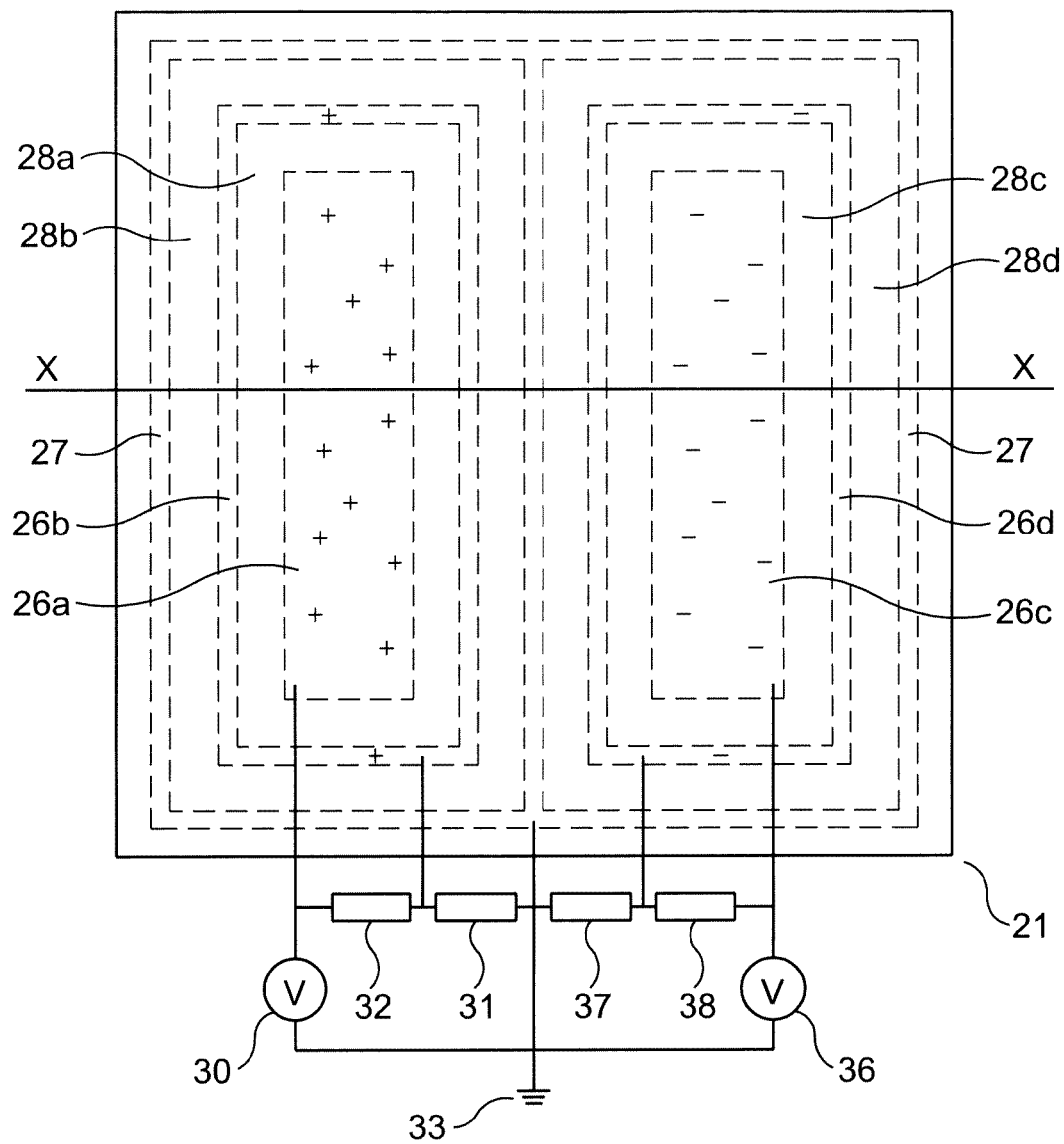
FIG. 7 is a plan view, taken from above, of the top layer of an electrostatic clamp according to an embodiment of the invention.

FIG. 7 depicts a plan view of the clamp 21 according to an embodiment of the invention, a portion of which is depicted by the cross-section view in FIG. 6. The clamp 21 shown in FIG. 7 is of a bipolar form with the partial cross-section of FIG. 6 showing only one half of the clamp, in particular the left side of the clamp as viewed in FIG. 7. The right-hand side of FIG. 7 is an identical mirror image differing only in the sign of the voltages applied to the electrodes as will be explained below. In FIG. 7 the electrodes on the left-hand side of the Figure are provided with a positive voltage, while the electrodes provided on the right-hand side of the Figure are provided with a negative voltage.

Looking firstly at the left-hand side of FIG. 7, the first electrode 26a is coupled to the voltage supply 30 and is here depicted being supplied with a positive voltage, with respect to the earth connection 33. The second electrode 26b surrounds the first electrode 26a and is supplied with a smaller positive voltage according to the ratio of the first and second resistors (31, 32) as described by equation (2), resulting in the barrier 28a between the first electrode 26a and the second electrode 26b being subject to the voltage difference between the first and second electrodes (26a, 26b). The ground electrode 27 surrounds the second electrode 26b and is connected to the earth connection 33. The barrier 28b between the second electrode 26b and the ground electrode 27 is subject to the voltage difference between the second and ground electrodes (26b, 27).

The first electrode 26a may have dimensions of 145 mm and 35 mm. The second electrode 26b may be between 0.1 mm and 1 mm, e.g. 0.3 mm (about 1% of the width of the first electrode), in width, and may surround the first electrode 26a as shown in FIG. 7. Conceivably the width of the second electrode could be as large as the width of a burl or width of the burl pitch, which may be 5 mm or even 10 mm in reticle clamps. The barrier 28a between the first electrode 26a and the second electrode 26b may be 0.7 mm in width and the barrier 28b between the second electrode 26b and the ground electrode 27 may have a similar dimension. It will be understood, however, that these dimensions are exemplary only and may be varied depending on the particular application. Typical values for the resistors are around 300 MOhms. When a voltage of around 3 kV is divided by three resistors of 330 MOhms, the current is 1 µA and the resistor dissipation is 1 mW.

The selection of resistors may be made with consideration of the effect of switching at high speed. While it is beneficial to use as large a resistor as possible, resulting in reduced current and therefore power dissipation, a larger resistor will contribute to an increased response time. For example, the second electrode 26b, having the dimensions discussed above, will have an area of approximately (145+145+35+35)×0.3 mm², or 108 mm². The geometric capacitance, or capacitance per unit area, can be found by the equation:

$$C_A = \varepsilon_0 \left[ \frac{\varepsilon_R}{d + g\varepsilon_R} \right] \quad (3)$$

where:
 $C_A$ is the capacitance per unit area.
All other symbols retain their usual meaning as described in relation to equation (1) above.

Assuming a dielectric thickness (d) of 50 µm, a relative dielectric strength ($\varepsilon_R$) of 5 and a burl height (g) of 20 µm, the capacitance per unit area ($C_A$) is 30 pF/cm². An electrode of this area will have a capacitance of approximately 32 pF.

It will be appreciated that in switching the electrode between voltages, the resistance of the resistor 32 will combine with the electrode capacitance to produce an RC time constant which will limit the speed with which the electrode voltage can be altered. It may be necessary for this rise time to be less than 0.1 s, and desirably less than 0.01 s. If an electrode capacitance of 32 pF was used, as illustrated above, then a resistance value of 330 MOhms would yield an RC time constant of approximately 0.01 s.

The right-hand side of FIG. 7 is a mirror image of the left and shows a second first electrode 26c surrounded by a second second electrode 26d, with the second electrode 26d being surrounded by the ground electrode 27. Barrier 28c is defined between electrodes 26c and 26d, and barrier 28d is defined between electrode 26d and ground electrode 27. Electrode 26c is supplied with a voltage by a second voltage supply 36 while electrode 26d is supplied with a voltage by a combination of resistors 37 and 38, the ratio of which defines the voltage supplied to the electrode 26d as described by equation (2). It will be understood that if power supply 30 supplies a positive voltage to electrodes 26a, 26b, then supply 36 will provide a negative voltage to electrodes 26c, 26d.

Figure 8:
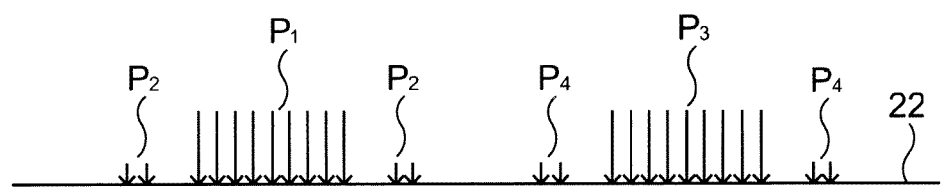
FIG. 8. depicts clamping pressures exerted on an article clamped by the electrostatic clamp of FIG. 7.

FIG. 8 depicts the clamping pressures exerted on the article to the clamped in the plane 22. A first clamping pressure $P_1$ is exerted by the first electrode 26a. A second clamping pressure $P_2$ is exerted by the second electrode 26b. The magnitudes of the clamping pressures are found by equation (1). Accordingly, assuming that the first and second resistors (31, 32) are approximately equally in value, then the voltage of the first electrode 26a will be twice that of the second electrode 26b. The resulting clamping pressure $P_1$ exerted by the first electrode 26a, will be four times the resulting clamping pressure $P_2$ exerted by the second electrode 26b. With the right-hand side being a mirror image, identical clamping pressures will be formed, eg electrode 26c generates clamping pressure $P_3$ and electrode 26d generates clamping pressure $P_4$. Assuming that the positive and negative sides of the clamp are identical other than the signs of the applied voltage, then $P_1$ will equal $P_3$ and $P_2$ will equal $P_4$.

The distance between the upper portion of the clamp 24 and the top of the burls 25 may be between 50 and 1000 μm but it will be understood that this dimension can be chosen as required by any specific application.

While only two burls 25 are shown in FIG. 6 it will be appreciated that in general multiple burls may be used.

It will be understood from FIG. 7 in particular that the clamp shown in that embodiment is generally rectangular and therefore in particular is suitable as a clamp for a reticle. Embodiments of the invention may equally be applied in an electrostatic clamp for a wafer. A clamp for a wafer would normally be circular and so the first electrodes 26a and 26c would generally be semi-circular in shape, the second electrodes 26b, 26d would be D-shaped, and the ground electrode 27 would be circular. Alternatively other structures could be imagined in which multiple first electrodes were provided each of which was a segment of a circle.

The second electrodes 26b, 26d may be considered to be intermediate electrodes in that they are held at voltages intermediate between the voltages of the first electrodes 26a, 26c and ground. Where a single intermediate electrode is provided it is desirable that this intermediate electrode be held at a voltage halfway between that of the first electrode and ground so that each barrier has the same potential across it. However, it may also be possible to provide two or more such intermediate electrodes between a first electrode and ground. For example, two intermediate electrodes may be provided such that there are three barriers between the first electrode and ground. In such a case to divide the potential equally across all barriers, the intermediate electrode proximate to the first electrode may be held at ⅔ of the voltage of the first electrode, and then the second intermediate electrode (proximate the ground electrode) may be held at ⅓ A of the voltage of the first electrode. In general it will be appreciated that multiple intermediate electrode may be used with the voltages applied between them in a stepped manner to produce equal potentials across the barriers that are thus formed.

It will be understood that the presence of multiple barriers may reduce the area available for electrodes and may therefore reduce the total clamping force. However, this can be compensated for by slightly increasing the supply voltage which would not have to be increased greatly given that the clamping pressure is a function of the square of the voltage.

In principle, each electrode may be provided with its own power supply to prove the necessary voltage, but such a structure would be complicated and unnecessarily expensive requiring additional high voltage amplifiers. Desirably therefore a plurality of electrodes, all of which are to be provided with a voltage of the same sign, are connected to a single power supply with a resistor network being provide to divide the power supply between electrodes. Such a structure may have the advantage of accurate voltage control, for example there is no possibility of software errors, and is simple and of low cost. Possibly one of the resistors may be a variable resistor to allow real-time control and adjustment.

In some embodiments of the invention, there may be multiple groups of electrodes, all of which are provided with a voltage of the same sign, and in such structures it may be desirable to provide each group of electrodes with its own power supply and its own resistive network dividing the voltage between the electrodes within the group.

It will also be appreciated that while only equal division of clamping voltage between electrodes is shown, a non-equal division may be used. This may enable the clamping pressure to be controlled so as to provide a shaped clamping pressure rather than a uniform clamping pressure. For example the pressure gradient at the clamp edges may be shaped for beneficial effect particularly, for example, where there may an overhang of the article being supported and it may be desired to control the pressure gradient at the edge to minimize the risk of damage to the article and/or to optimize edge flatness.

In the above description reference has been made to ground and a ground electrode. It should be noted however that while a ground electrode is particularly desired, it may also be possible to use an electrode held at a fixed voltage and the voltages applied to the first electrode(s) and the intermediate electrodes may be determined relative to that fixed voltage.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may be made in this text to the use an electrostatic clamp in lithographic apparatus, it should be understood that the electrostatic clamp described herein may have other applications, such as for use in reticle inspection apparatus, wafer inspection apparatus, aerial image metrology systems and more generally in any semi-conductor manufacturing system or apparatus that measures or processes an article such as a wafer or reticle either in vacuum or in ambient (non-vacuum) conditions, such as, for example in a plasma etcher or a deposition apparatus.

The terms "radiation" and "beam" as used herein encompass all types of electromagnetic radiation, including ultra-violet (UV) radiation (e.g. having a wavelength of or about 365, 355, 248, 193, 157 or 126 mn) and extreme ultraviolet (EUV) radiation (e.g. having a wavelength in the range of 5-20 mn), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. An electrostatic clamp configured to, in use, hold an article, the clamp comprising:
    a lower portion;
    an upper portion formed of a dielectric material; and
    a plurality of electrodes disposed between said lower portion and said upper portion, said electrodes comprising
        a first electrode configured, in use, to be held at a first voltage,
        at least one intermediate electrode configured, in use, to be held at a second voltage, and
        a ground electrode,
    wherein said at least one intermediate electrode is located between said first electrode and said ground electrode and said second voltage is between said first voltage and ground.

2. An electrostatic clamp as claimed in claim 1, wherein said at least one intermediate electrode is, in use, held at a voltage halfway between the first voltage and ground.

3. An electrostatic clamp as claimed in claim 1, wherein a plurality of intermediate electrodes are provided between the first electrode and the ground electrode, and wherein, in use, the voltage applied to each of said plurality of intermediate electrodes reduces from the first electrode to the ground electrode.

4. An electrostatic clamp as claimed in claim 3, wherein the voltage drop between the first electrode and a first intermediate electrode and between adjacent intermediate electrodes is the same.

5. An electrostatic clamp as claimed in claim 1, wherein said first electrode and said at least one intermediate electrode share a common power supply and a resistive network is provided to divide the applied voltage between the first electrode and the at least one intermediate electrode.

6. An electrostatic clamp as claimed in claim 5, wherein said resistive network includes a variable resistor.

7. An electrostatic clamp as claimed in claim 1, wherein said clamp is a bipolar clamp further comprising
    a second first electrode, and
    at least one second intermediate electrode located between said second first electrode and said ground electrode,
    wherein, in use, said second first electrode and said at least one second intermediate electrode are held respectively at a first voltage and a second voltage that are of opposite sign to the voltages applied to said first electrode and said first intermediate electrode, and
    wherein the second voltage applied to said second intermediate electrode is between the first voltage applied to the second first electrode and ground.

8. An electrostatic clamp as claimed in claim 1, wherein said first electrode is generally rectangular and said clamp is configured for use as a reticle clamp.

9. An electrostatic clamp as claimed in claim 1, wherein said first electrode is generally in the shape of a segment of a circle and said clamp is configured for use as a wafer clamp.

10. A semiconductor manufacturing apparatus comprising an electrostatic clamp configured to, in use, hold an article, the claim comprising:
    a lower portion;
    an upper portion formed of a dielectric material; and
    a plurality of electrodes disposed between said lower portion and said upper portion, said electrodes comprising
        a first electrode configured, in use, to be held at a first voltage,
        at least one intermediate electrode configured, in use, to be held at a second voltage, and
        a ground electrode,
    wherein said at least one intermediate electrode is located between said first electrode and said ground electrode and said second voltage is between said first voltage and ground.

11. A semiconductor manufacturing apparatus as claimed in claim 10, wherein the semiconductor manufacturing apparatus is one of a lithographic apparatus, a reticle inspection apparatus, a wafer inspection apparatus, and an aerial image metrology apparatus.

12. A semiconductor manufacturing apparatus as claimed in claimed 10, wherein said clamp is a bipolar clamp further comprising:
    a second first electrode, and
    at least one second intermediate electrode located between said second first electrode and said ground electrode,
    wherein, in use, said second first electrode and said at least one second intermediate electrode are held respectively at a first voltage and a second voltage that are of opposite sign to the voltages applied to said first electrode and said first intermediate electrode, and
    wherein the second voltage applied to said second intermediate electrode is between the first voltage applied to the second first electrode and ground.

* * * * *